(12) United States Patent
Caer et al.

(10) Patent No.: US 11,619,785 B2
(45) Date of Patent: Apr. 4, 2023

(54) TUNABLE WAVEGUIDE GRATING WITH A HEATING LAYER

(71) Applicant: IMEC vzw, Leuven (BE)

(72) Inventors: Charles Caer, Uccle (BE); Sarvagya Paavan Dwivedi, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 17/404,173

(22) Filed: Aug. 17, 2021

(65) Prior Publication Data

US 2022/0057581 A1 Feb. 24, 2022

(30) Foreign Application Priority Data

Aug. 18, 2020 (EP) .................................... 20191442

(51) Int. Cl.
*G02B 6/34* (2006.01)
*G01S 7/481* (2006.01)
*G02F 1/01* (2006.01)

(52) U.S. Cl.
CPC .............. *G02B 6/34* (2013.01); *G01S 7/4817* (2013.01); *G02F 1/0147* (2013.01)

(58) Field of Classification Search
CPC ............ G02B 6/34; G02B 2006/12061; G02B 2006/12085; G02B 2006/12107; G02B 2006/12121; G01S 7/4817; G01S 7/4814; G02F 1/0147; H01S 5/0612; H01S 5/021; H01S 5/141; H01S 5/1032
See application file for complete search history.

(56) References Cited

U.S. PATENT DOCUMENTS

| | | | |
|---|---|---|---|
| 2004/0071386 A1 | 4/2004 | Nunen et al. | |
| 2004/0105480 A1* | 6/2004 | Sidorin | H01S 5/141 372/20 |
| 2006/0098911 A1 | 5/2006 | Sandhu et al. | |
| 2010/0054653 A1* | 3/2010 | Carothers | G02B 6/122 438/682 |
| 2010/0119231 A1 | 5/2010 | Kim et al. | |
| 2012/0014398 A1 | 1/2012 | Choi | |
| 2013/0114635 A1* | 5/2013 | Kuksenkov | H01S 5/0612 372/50.11 |
| 2016/0154180 A1* | 6/2016 | Fournier | G02B 6/12004 438/31 |
| 2016/0276803 A1* | 9/2016 | Uesaka | H01S 5/06258 |

(Continued)

OTHER PUBLICATIONS

Extended European Search Report in EP Application No. 20191442.1, dated Jan. 21, 2021.

(Continued)

*Primary Examiner* — Ellen E Kim
(74) *Attorney, Agent, or Firm* — Knobbe Martens Olson & Bear, LLP

(57) ABSTRACT

An optical device including a waveguide grating is disclosed. The optical device may be used as an optical cavity for a laser device, for instance, of an integrated laser device for light detection and ranging (Lidar) applications. In one aspect, the optical device includes a waveguide grating for guiding light, a heating layer provided beneath or above the waveguide grating, and two or more contacts for passing a current through the heating layer, to generate heat in the heating layer. The heating layer is thermally coupled to the waveguide grating and is optically decoupled from the waveguide grating.

20 Claims, 7 Drawing Sheets

(56) References Cited

U.S. PATENT DOCUMENTS

2017/0023736 A1* 1/2017 Bauters .................. G02B 6/136
2017/0131576 A1   5/2017 Gill et al.
2018/0205200 A1* 7/2018 Kwon ...................... G02B 6/12

OTHER PUBLICATIONS

Cunningham et al., Highly-efficient thermally-tuned resonant optical filters, Optics Express, vol. 18, No. 18, Aug. 2010, pp. 19055-19063.

Jacques et al., Optimization of thermo-optic phase-shifter design and mitigation of thermal crosstalk on the SOI platform, Optics Express, vol. 27, No. 8, Apr. 2019, pp. 10456-10471.

Liu et al., Thermally Tunable Silicon Nitride Sampled Gratings in Polymer, IEEE Photonics Technology Letters, vol. 25, No. 17; Sep. 1, 2013.

Patel et al., A 4x4 fully non-blocking switch on SOI based on interferometric thermo-optic phase shifters, 2014 Optical Interconnects Conference IEEE, pp. 104-105, May 2014.

Pintus et al., Optimization of Integrated Silicon Doped Heaters for Optical Microring Resonators, ECOC 2016, $42^{nd}$ European Conference and Exhibition on Optical Communications, Sep. 2016, pp. 698-700.

Song et al., High Efficiency Optical Switches with Heater-on-Slab (HoS) Structures, Optical Society of America, 2011 Optical Fiber Communication Conference and Exposition and the National Fiber Optic Engineers Conference, Mar. 2011, in 3 pages.

Zhang et al., Silicon Photonic Integrated Optoelectronic Oscillator for Freque3ncy-Tunable Microwave Generation, Journal of Lightwave Technology, vol. 36, No. 19, pp. 4655-4663, Oct. 1, 2018.

\* cited by examiner

TUNABLE WAVEGUIDE GRATING WITH A HEATING LAYER

CROSS-REFERENCE TO RELATED APPLICATIONS

This application claims foreign priority to European Application No. 20191442.1, filed Aug. 18, 2020, the contents of which are incorporated by reference herein in its entirety.

BACKGROUND

Technological Field

The disclosed technology relates to an optical device including a waveguide grating. The optical device may be used as an optical cavity of a laser device, for instance, of an integrated laser device suitable for light detection and ranging (Lidar) applications. In particular, the waveguide grating of the optical device is tunable by using an integrated heating layer to exploit the thermo-optic effect.

Description of the Related Technology

Lidar systems, which rely on optical phase arrays, require a coherent light source. In this respect, for example, an integrated laser device is beneficial for a Lidar system, as the integrated laser device ensures scalability, and also footprint and cost reduction.

One requirement of such an integrated laser device for a Lidar system is a very narrow linewidth. Such a narrow linewidth can, for example, be achieved by using a long, weakly coupled waveguide grating (as an optical cavity of the laser device). Such a waveguide grating may advantageously be fabricated in silicon nitride, as the waveguide grating technology requires extremely low-loss waveguides, which cannot be made, for instance, of conventional silicon-on-insulator (SOI).

It is further desirable that a laser device for a Lidar system is tunable, in particular, for performing beam scanning. One way to tune the laser is to tune the waveguide grating, for instance, by applying heat to it and exploiting the thermo-optic effect, which changes the refractive index of the waveguide grating material in response to the temperature change. However, suitable materials for waveguide gratings, like silicon nitride, have typically a very low thermo-optic coefficient, and therefore need a very large Joule heating to experience a significant tuning (phase shift), and consequently enable a significant tuning of the laser. Unfortunately, on the one hand, excessive heat can be detrimental to the laser device performance and reliability, while on the other hand, an inhomogeneous heating can negatively affect the waveguide grating properties.

In summary, tuning a long waveguide grating (for instance, made from silicon nitride) is quite challenging, because a large bias current is required to generate enough heat to significantly change the refractive index, and because homogeneous heating along the long waveguide grating without any thermal cross-talk with other devices is difficult to achieve.

In an exemplary approach, a top heating element is used to heat the waveguide grating, i.e., a heating element that is arranged above the waveguide grating. The heating element may be made of tungsten. However, such a heating element leads to optical loss (due to the use of the metal), low efficiency, and thermal cross-talk with other devices.

SUMMARY OF CERTAIN INVENTIVE ASPECTS

In view of the above-mentioned challenges, embodiments of the disclosed technology aim to provide an improved optical device, which can be used to provide a tunable laser device with a narrow linewidth. An objective is to provide an optical device that includes a tunable waveguide grating, which is tunable based on a thermo-optic shift. The optical device should allow a homogeneous heating of the waveguide grating without producing excessive heat.

Other objectives, features and advantages of the disclosed technology will appear from the present disclosure.

A first aspect of the disclosed technology provides an optical device including: a waveguide grating for guiding light; a heating layer provided beneath or above the waveguide grating; and two or more contacts for passing a current through the heating layer, to generate heat in the heating layer; wherein the heating layer is thermally coupled to the waveguide grating and is optically decoupled from the waveguide grating.

A waveguide grating generally includes a waveguide core, which is coupled to a grating. For instance, the grating may be arranged on the waveguide core, or may be arranged on the side of the waveguide core, or may be engraved into the waveguide core, or may be arranged next to the waveguide core, or may be provided parallel to the waveguide core. A grating may include a plurality of regularly spaced elements, which may essentially be identical. These elements may, for example, be parallel, elongated elements that are arranged one after the other along the extension direction of the waveguide grating.

The heating layer in the optical device can be used to tune the waveguide grating. The thermal coupling between the waveguide grating and the heating layer can maximize the heat transfer. The optical decoupling of the heating layer and the waveguide grating results in the heating layer having no influence on an optical mode of light in the waveguide grating, particularly not adding any optical loss.

Notably, the heating layer is thermally coupled to the waveguide grating and is optically decoupled from the waveguide grating. Being optically decoupled in this case may mean except for an optical coupling that results from the thermal coupling. Accordingly, the heating layer may by indirectly optically coupled to the waveguide grating as a result of the thermal coupling. In particular, thermal coupling between the heating layer and the waveguide grating may result in temperature changes in the waveguide grating, and thus in a phase shift of light guided in the waveguide grating.

The optical device of the first aspect thus includes a tunable waveguide grating, which is tunable based on the thermo-optic effect. The waveguide grating can be heated homogeneously without producing excessive heat. The optical device may rely exclusively on CMOS-compatible materials and processes. The optical device also enables a strong reduction of the required electrical current and thermal cross-talk with other devices, while ensuring the homogeneous heating of the waveguide grating.

In an implementation of the optical device, the heating layer is configured to not support and/or influence an optical mode of the light guided in the waveguide grating.

In an implementation of the optical device, the heating layer is transparent in the wavelength range of the light guided in the waveguide grating.

Thus, the heating layer introduces no (or only negligible) optical loss.

In an implementation of the optical device, the heating layer is in direct thermal contact with the waveguide grating.

Thus, the homogeneous heating of the waveguide grating with minimal heat generation is possible.

In an implementation of the optical device, the heating layer has a thickness of below 100 nm, particularly in a range of 20-70 nm; and/or the waveguide grating has a thickness of between 200-1200 nm.

Such a thin heating layer allows reducing the thermal resistance and therefore the current needed to heat the waveguide grating, and to achieve a significant phase shift.

In an implementation of the optical device, the heating layer comprises silicon, amorphous silicon, silicon carbide, germanium, a thin-film diamond, aluminum nitride, or boron nitride; and/or the waveguide grating comprises silicon nitride, aluminum nitride, tantalum pentoxide, niobium pentoxide, or titanium oxide.

In an implementation of the optical device, the heating layer is an unpatterned thin layer provided directly on top of the waveguide grating.

This provides a very simple implementation of the optical device.

In an implementation of the optical device, the heating layer is made of amorphous silicon or silicon carbide, and the waveguide grating is made of silicon nitride.

In an implementation of the optical device, the heating layer is a patterned layer arranged below the waveguide grating, wherein the heating layer is patterned to have a reduced thickness underneath the waveguide grating and to have one or more pedestals connected to the waveguide grating.

This provides an efficient optical device, and enables the use of an SOI substrate.

In an implementation of the optical device, the one or more pedestals each have a width in a range of 40-50 nm.

Such narrow pedestals are sufficient to transfer heat efficiently from the heating layer to the waveguide grating.

In an implementation of the optical device, the heating layer is a patterned silicon layer of a SOI substrate, and the waveguide grating is made of silicon nitride.

In an implementation of the optical device, the waveguide grating and the heating layer are embedded into a dielectric material, particularly an oxide.

In an implementation of the optical device, the waveguide grating includes a waveguide core and a grating arranged on the waveguide core, or arranged on the side of the waveguide core, or engraved into the waveguide core, or arranged next to the waveguide core, particularly provided parallel to the waveguide core.

In an implementation of the optical device, the two or more contacts include a first contact and a second contact; the first contact is provided on one side of the waveguide grating and extends in parallel to the waveguide grating; and the second contact is provided on the other side of the waveguide grating and extends in parallel to the waveguide grating.

This allows a homogenous current density to be passed to the heating layer and across the waveguide grating, and thus leads to a very homogeneous heating of the waveguide grating.

A second aspect of the disclosed technology provides a tunable laser device for Lidar applications, the tunable laser device including at least one optical device according to the first aspect or any of its implementations, wherein the optical device is an optical cavity of the tunable laser device.

The laser device of the second aspect is tunable at least due to the tunable waveguide grating of the optical device. In particular, the laser device can be tuned by heating the waveguide grating by passing a current through the heating layer. The laser device can be provided with a narrower linewidth with the waveguide grating. The laser device of the second aspect enjoys all advantages of the optical device of the first aspect and its respective implementations.

BRIEF DESCRIPTION OF THE DRAWINGS

The above-described aspects and implementations are explained in the following description of embodiments with respect to the enclosed drawings.

DETAILED DESCRIPTION OF CERTAIN ILLUSTRATIVE EMBODIMENTS

Figures 1A, 1B:
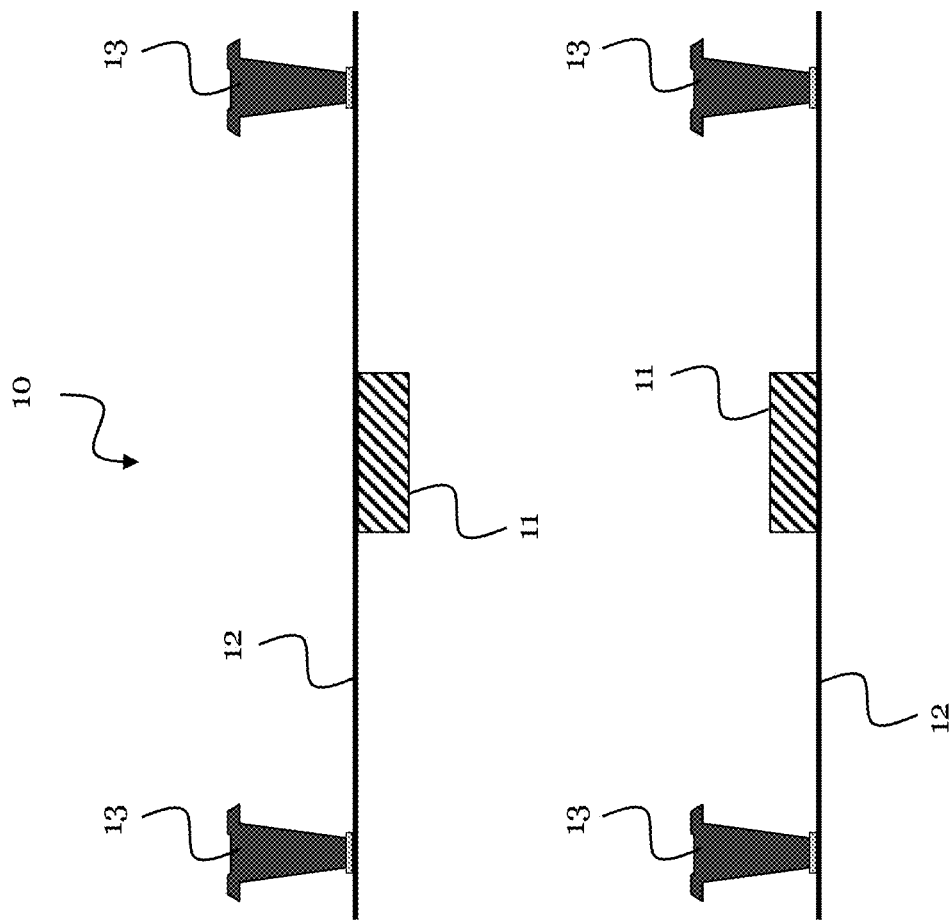
FIGS. 1A and 1B show a working principle of an optical device according to an embodiment of the disclosed technology.

FIGS. 1A and 1B illustrate a working principle of an optical device 10 according to an embodiment of the disclosed technology. The optical device 10 can be used as an optical cavity of a tunable laser device, for instance, a laser device for Lidar applications.

The optical device 10 includes a waveguide grating 11 for guiding light, in particular, for guiding laser light received from a laser source of the laser device. The optical device 10 may function as an optical cavity for this (laser) light. The light may, for instance, have a wavelength in a range of 900-1600 nm, but may also have a wavelength in the visible light range.

Further, a heating layer 12 is provided beneath (see FIG. 1B) or above (see FIG. 1B) the waveguide grating 11. In some examples, the heating layer 12 is a thin layer, for instance, has a thickness of below 100 nm. More particularly, the heating layer 12 may have a thickness in a range of 20-70 nm, or even 20-30 nm. In comparison, the waveguide grating 11 may have a thickness in a range of 200-1200 nm. Thickness may mean, for the heating layer 12, its extension along the direction perpendicular to the plane of the heating layer 12. For the waveguide grating 11, thickness may mean its extension along the direction perpendicular to the plane it extends in. In FIGS. 1A and 1B, thickness is vertically.

The optical device 10 further includes two or more contacts 13 for passing a current through the heating layer 12. This current generates heat in the heating layer 12. Beneficially, if the heating layer 12 is very thin, not much current is required. Furthermore, the contacts 13 and the heating layer 12 together allow a homogeneous heating of the heating layer 12 and thus the waveguide grating 11.

Further, the heating layer 12 is thermally coupled to the waveguide grating 11, particularly, it may be directly coupled thermally to the waveguide grating 11. For instance, the heating layer 12 may be provided on (top of) the waveguide grating 11 or vice versa (the waveguide grating 11 may be provided on (top of) the heating layer 12). The heating layer 12, however, may be thermally coupled by some coupling elements to the waveguide grating 11. This allows efficiently transferring the heat that is produced in the heating layer 12 to the waveguide grating 11. Thus, excessive heat generation can be avoided.

The heating layer 12 is further optically decoupled from the waveguide grating 11, in particular, if it is designed to be very thin like described above. Thus, the heating layer 12 may not support and/or influence an optical mode of the light guided in the waveguide grating 11, and also does not introduce any optical loss. In particular, the heating layer 12 may be transparent in the wavelength range of the light guided in the waveguide grating 11.

The heating layer 12 may generally be made of at least one of: silicon, amorphous silicon, silicon carbide, germanium, a thin-film diamond, aluminum nitride, boron nitride. The waveguide grating 11 may generally be made of at least one of: silicon nitride, aluminum nitride, tantalum pentoxide, niobium pentoxide, titanium oxide.

Figure 2:
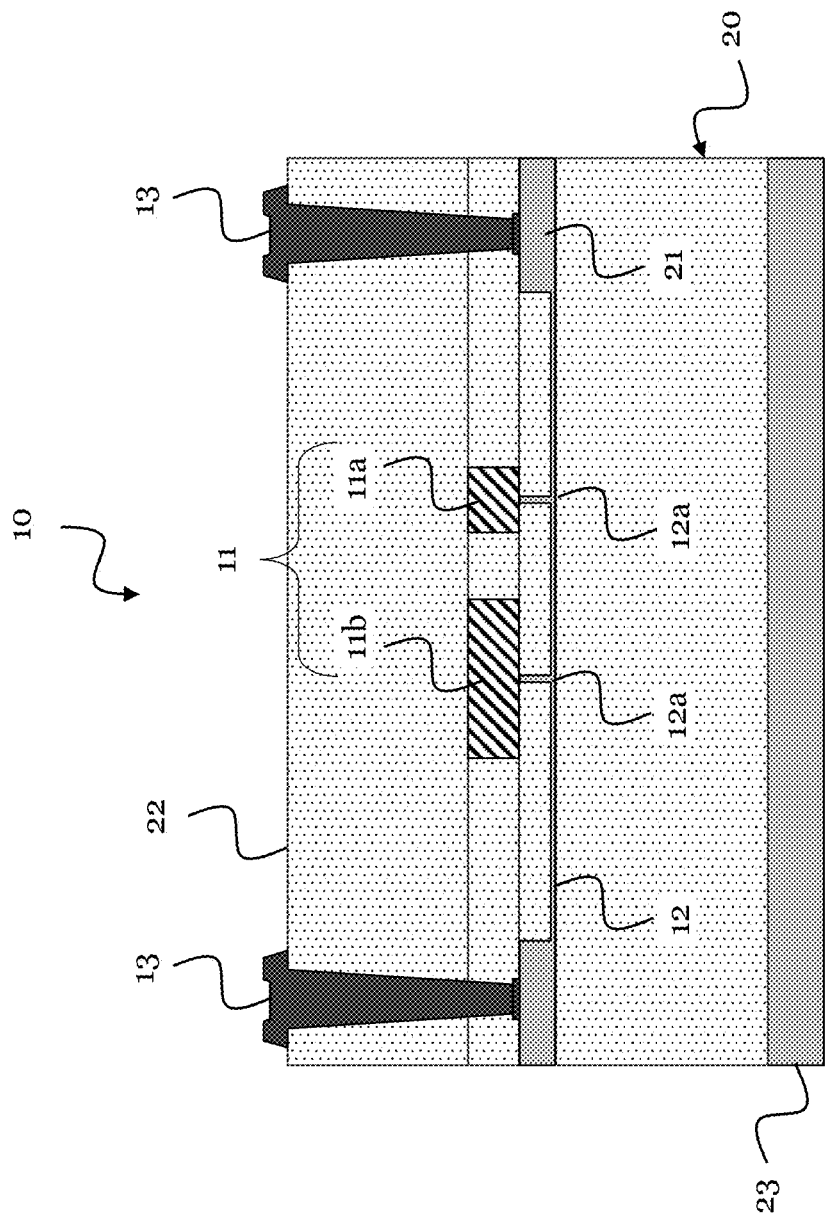
FIG. 2 shows an optical device according to an embodiment of the disclosed technology.

FIG. 2 shows an optical device 10 according to an embodiment of the disclosed technology, which builds on the working principles illustrated in FIGS. 1A and 1B. The same elements in FIGS. 1A and 1B and FIG. 2 are labelled with the same reference signs, and may be implemented likewise. In particular, FIG. 2 shows an embodiment of the optical device 10, wherein the heating layer 12 is provided beneath the waveguide grating 11.

Thereby, FIG. 2 shows further that the heating layer 12 may be a patterned layer. The patterned heating layer 12 is arranged below the waveguide grating 11, and is particularly patterned such that its thickness is reduced beneath the waveguide grating 11. For instance, the reduced thickness may be 20-30 nm. The thickness of the heating layer 12 can be larger where it is not arranged directly underneath the waveguide grating 11. For instance, the thickness here can be as large as the thickness of a silicon layer 21 of a SOI substrate 20 or wafer. Accordingly, the heating layer 12 may be a patterned silicon layer 21 of a SOI substrate 20 or wafer (further including a silicon base layer 23, and insulator material in between the silicon layers 21 and 23).

Furthermore, the heating layer 12 may have one or more pedestals 12a connected to the waveguide grating 11. That is, the one or more pedestals 12a may be structured by the patterning process, which results in the patterned heating layer 12. For instance, the pedestals 12a may be formed at the same time the portion of the heating layer 12 with reduced thickness is formed underneath the waveguide grating 11. Each pedestal 12a may have a width (perpendicular to its thickness, and perpendicular to the extension direction of the waveguide grating 11) in a range of 40-50 nm.

FIG. 2 shows also that the waveguide grating 11 may include a waveguide core 11a and a grating 11b provided adjacent to the waveguide core 11a. The waveguide core 11a may guide the light (as, for example, provided by the laser source of the laser device). The grating 11b could alternatively be provided on (top of) the waveguide core 11a, or on a side face of the waveguide core 11a, or engraved or imprinted into/onto the waveguide core 11a.

The waveguide grating 11 and the heating layer 12 may be embedded into a dielectric material 22, particularly, may be embedded into an oxide. Further, the contacts 13 may also be, at least partly, embedded into the dielectric material 22. The contacts 13 may be connected to the thicker part of the patterned heating layer 12. The contacts 13 may thereto penetrate through the dielectric material 22.

In the embodiment of the optical device 10 shown in FIG. 2, the heating layer 12 may be a silicon layer 21, for example, may be a silicon layer of the SOI substrate 20. Further, the waveguide grating 11 may be made of silicon nitride.

Figure 3:
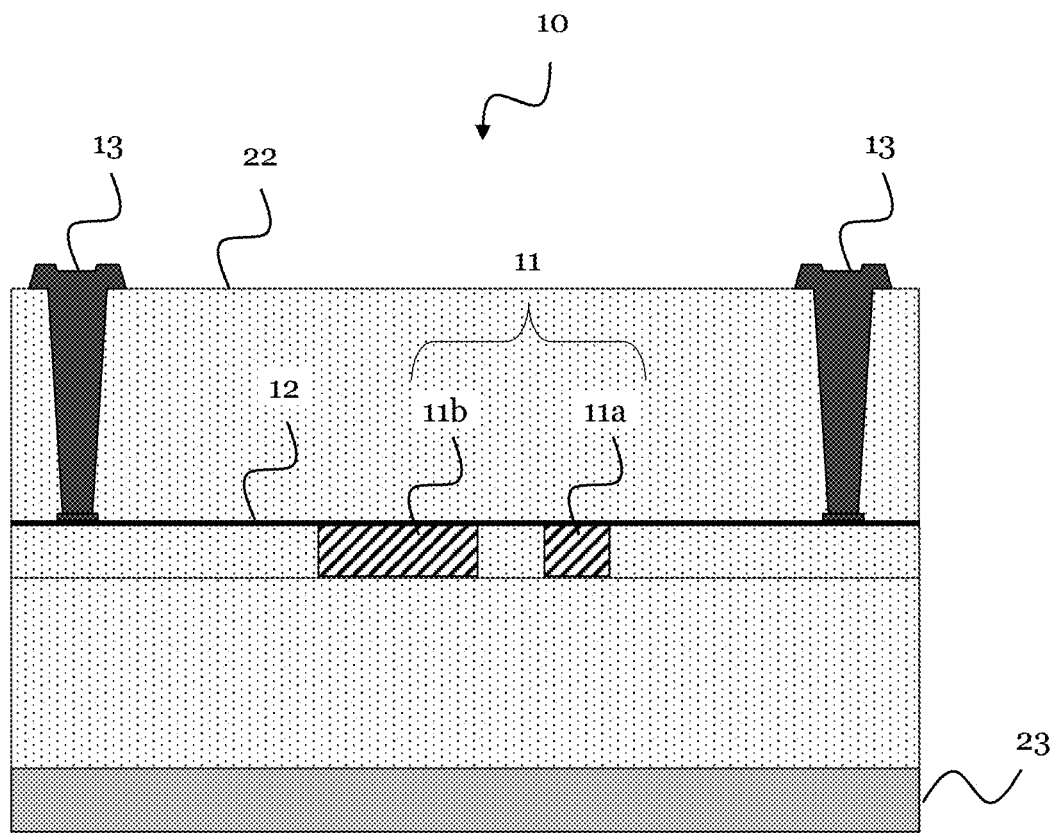
FIG. 3 shows an optical device according to an embodiment of the disclosed technology.

FIG. 3 shows an optical device 10 according to an embodiment of the disclosed technology, which builds on the working principle illustrated in FIGS. 1A and 1B. The same elements in FIGS. 1A and 1B and FIG. 3 are labelled with the same reference signs, and may be implemented likewise. FIG. 3 also shares some elements with FIG. 2, wherein the same elements are again labelled with the same reference signs and may be implemented likewise. In particular, FIG. 3 shows an embodiment of the optical device 10, wherein the heating layer 12 is provided above the waveguide grating 11.

In particular, the heating layer 12 may be an unpatterned, particularly, planar layer, which is provided directly on (top of) the waveguide grating 11. The heating layer 12 may be a homogeneously thin layer, for instance, with a homogeneous thickness in a range of 20-70 nm, particularly in a range of 20-30 nm.

Like in FIG. 2, the waveguide grating 11 may include a waveguide core 11a and a grating 11b. Further, like in FIG. 2, the waveguide grating 11 and the heating layer 12 may be embedded into a dielectric material 22. The contacts 13 may, like in FIG. 2, be partly embedded into the dielectric material 22, and may connect to the heating layer 12 through the dielectric material 22, from above.

In the embodiment of the optical device 10 shown in FIG. 3, the heating layer 12 may be made of amorphous silicon and the waveguide grating 11 may be made of silicon nitride. Alternatively, in particular for a wavelength of around 900 nm (e.g., of 905 nm) and/or for visible wavelengths, the heating layer 12 may be made of silicon carbide and the waveguide grating 11 may be made of silicon nitride.

Alternative materials for the silicon nitride may be materials that have a refractive index and transparency window (for example, in the visible to mid infra-red), which is similar to that of silicon nitride. For instance, aluminum nitride, tantalum pentoxide, niobium pentoxide, or titanium oxide may be used as alternative material. Alternative materials for the heating layer 12 may be materials that are transparent at the same wavelength range than the amorphous silicon or silicon carbide, respectively, and may have a large thermal conductivity enabling efficient heat channeling. For instance, germanium, a thin-film diamond, aluminum nitride, or boron nitride may be used as alternative materials.

Figure 4:
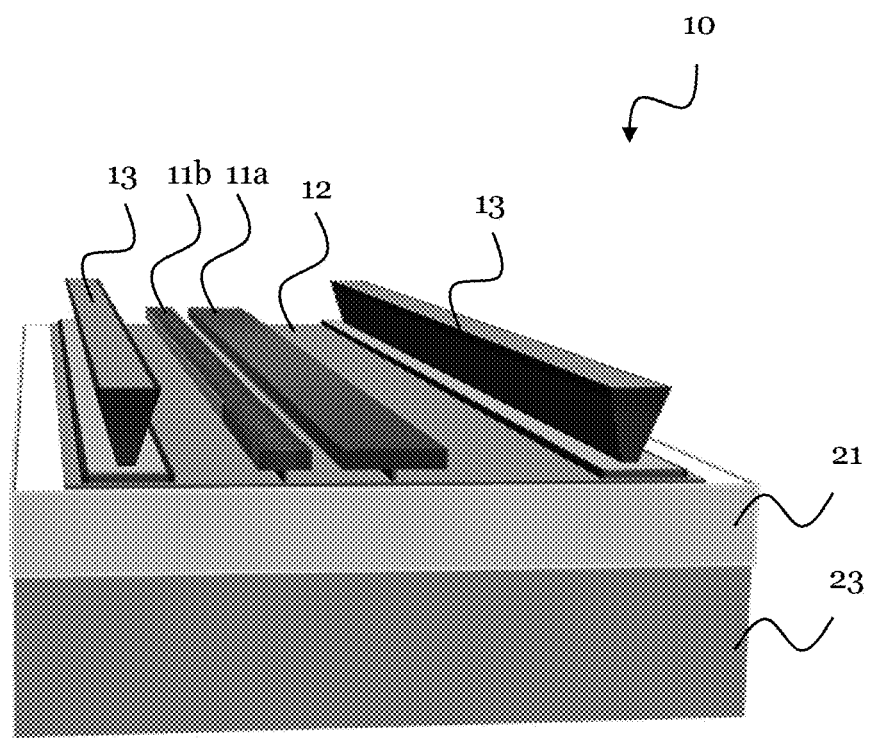
FIG. 4 shows a perspective view of an optical device according to an embodiment of the disclosed technology.
Figure 5:
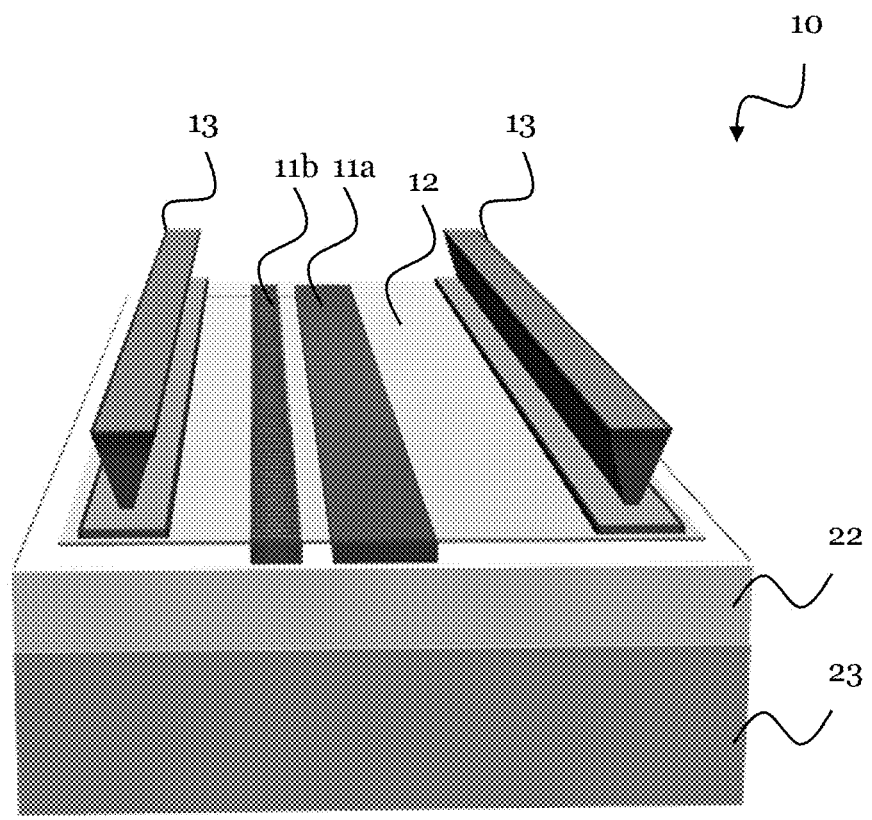
FIG. 5 shows a perspective view of an optical device according to an embodiment of the disclosed technology.

FIG. 4 and FIG. 5 show, respectively, a perspective view of an optical device 10 that builds on the optical device 10 shown in FIG. 2 (that is, the heating layer 12 is beneath the waveguide grating 11) and on the optical device 10 shown in FIG. 3 (that is, the heating layer 12 is above waveguide grating 11).

In both FIG. 4 and FIG. 5 it can be seen that the waveguide core 11a may run/extend parallel to the grating 11b along an extension direction of the waveguide grating 11. Further, the contacts 13, which may include a first and second contact 13, which are arranged on opposite sides of the waveguide grating 11, may also run/extend parallel to the waveguide grating 11. This allows to heat the heating layer 12, and in consequence the waveguide grating 11, very homogeneously along its length.

FIG. 4 and FIG. 5 indicate further that the optical device 10 may be an optical cavity for a laser device, wherein the optical cavity is tunable by means of tuning the waveguide grating 11 via the thermo-optic effect. Applying heat via the heating layer 12 shifts a phase of light guided in the waveguide grating 11, and thus tunes a laser device using the optical device 10 as optical cavity.

Figure 6:
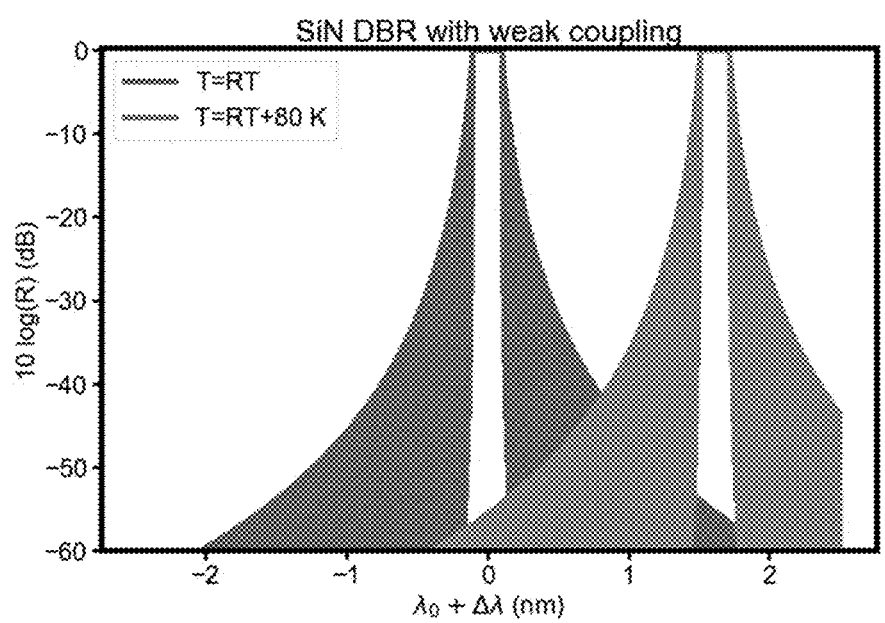
FIG. 6 shows a thermo-optic phase shift of a waveguide grating of an optical device according to an embodiment of the disclosed technology.

In this respect, FIG. 6 shows a simulation of the temperature increase, which is required to shift a silicon nitride waveguide grating 11 stopband by 2 nm. In particular, starting from room temperature (RT), a temperature change of about 80K is required for this shift.

Figures 7A, 7B:
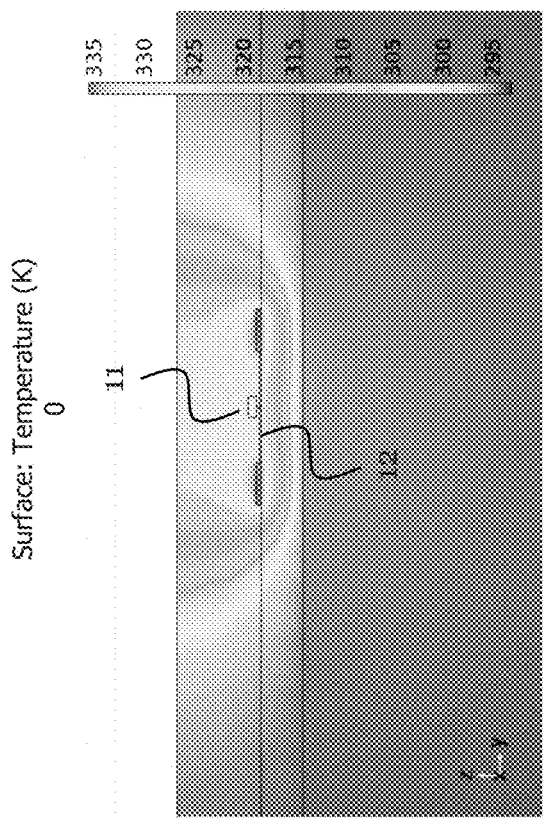
FIG. 7A shows a simulated comparison of a conventional top heating element used to heat the waveguide grating according to an embodiment of the disclosed technology.
FIG. 7B shows a simulated comparison of a heating layer to heat the waveguide grating in an optical device according to an embodiment of the disclosed technology.

FIGS. 7A and 7B shows simulations comparing the heating of a waveguide grating 71 using a conventional top heating element 72 (FIG. 7A) to the heating of a waveguide grating 11 using a heating layer 12 in an optical device 10 according to an embodiment of the disclosed technology (FIG. 7B).

In the optical device 10 according to an embodiment of the disclosed technology, a higher heating efficiency of heating the waveguide grating 11 is achieved, for instance, due to the direct thermal contact between the waveguide grating 11 and the heating layer 12. Further, there may be less thermal cross-talk with other devices than when using the top heating element 71. Moreover, less current is required to generate enough heat to significantly change the refractive index of the waveguide grating 11 than with the conventional top heating element 71, for instance, due to a more homogeneous heating of the along the long waveguide grating.

In summary, embodiments of the disclosed technology offer a solution to increase the heat transfer to a waveguide grating 11 without perturbing the optical mode, nor adding any loss to the waveguide grating 11. Having a direct contact between the heating layer 12 and the waveguide grating 11 can achieve a very efficient heat transfer compared to the exemplary case, wherein a metal heater is placed above the waveguide grating 11, and wherein the heat transfer is strongly hampered by poor oxide thermal conductivity.

What is claimed is:

1. An optical device comprising:
    a waveguide grating for guiding light;
    a heating layer provided beneath the waveguide grating; and
    two or more contacts for passing a current through the heating layer, to generate heat in the heating layer,
    wherein the heating layer is thermally coupled to the waveguide grating and is optically decoupled from the waveguide grating,
    wherein the heating layer is a patterned layer arranged below the waveguide grating, and wherein the heating layer is patterned to have a reduced thickness in an area directly underneath the waveguide grating relative to an area that is not directly underneath the waveguide grating, and wherein the heating layer is patterned to have one or more pedestals connected to the waveguide grating.

2. The optical device according to claim 1, wherein:
    the heating layer is configured to not influence an optical mode of the light guided in the waveguide grating.

3. The optical device according to claim 1, wherein:
    the heating layer is transparent in the wavelength range of the light guided in the waveguide grating.

4. The optical device according to claim 1, wherein:
    the heating layer is in direct thermal contact with the waveguide grating.

5. The optical device according to claim 1, wherein:
    the heating layer has a thickness in a range of 20-70 nm; and
    the waveguide grating has a thickness of between 200-1200 nm.

6. The optical device according to claim 1, wherein:
    the heating layer comprises silicon, amorphous silicon, silicon carbide, germanium, a thin-film diamond, aluminum nitride, or boron nitride; and
    the waveguide grating comprises silicon nitride, aluminum nitride, tantalum pentoxide, niobium pentoxide, or titanium oxide.

7. The optical device according to claim 1, wherein:
    the heating layer is a patterned silicon layer of a silicon-on-insulator substrate; and
    the waveguide grating is made of silicon nitride.

8. The optical device according to claim 1, wherein:
    the waveguide grating and the heating layer are embedded into a dielectric material comprising an oxide.

9. The optical device according to claim 1, wherein:
    the waveguide grating comprises at least one of a waveguide core and a grating arranged on the waveguide core, a waveguide core and a grating arranged on a side of the waveguide core, a waveguide core and a grating engraved into the waveguide core, a waveguide core and a grating arranged next to the waveguide core, and a waveguide core and a grating provided parallel to the waveguide core.

10. The optical device according to claim 1, wherein:
    the two or more contacts include a first contact and a second contact;
    the first contact is provided on one side of the waveguide grating and extends in parallel to the waveguide grating; and
    the second contact is provided on the other side of the waveguide grating and extends in parallel to the waveguide grating.

11. A tunable laser device for Lidar applications, the tunable laser device comprising at least one optical device according to claim 1, wherein the optical device is an optical cavity of the tunable laser device.

12. An optical device comprising:
    a waveguide grating for guiding light;
    a heating layer provided above the waveguide grating; and
    two or more contacts for passing a current through the heating layer, to generate heat in the heating layer,
    wherein the heating layer is thermally coupled to the waveguide grating and is optically decoupled from the waveguide grating,
    wherein the heating layer is an unpatterned thin layer provided directly on top of the waveguide grating, and
    wherein the heating layer is made of amorphous silicon or silicon carbide, and the waveguide grating is made of silicon nitride.

13. The optical device according to claim 12, wherein:
    the heating layer is configured to not influence an optical mode of the light guided in the waveguide grating.

14. The optical device according to claim 12, wherein:
the heating layer is transparent in the wavelength range of the light guided in the waveguide grating.

15. The optical device according to claim 12, wherein:
the heating layer is in direct thermal contact with the waveguide grating.

16. The optical device according to claim 12, wherein:
the heating layer has a thickness in a range of 20-70 nm; and
the waveguide grating has a thickness of between 200-1200 nm.

17. The optical device according to claim 12, wherein:
the waveguide grating and the heating layer are embedded into a dielectric material comprising an oxide.

18. The optical device according to claim 12, wherein:
the waveguide grating comprises at least one of a waveguide core and a grating arranged on the waveguide core, a waveguide core and a grating arranged on a side of the waveguide core, a waveguide core and a grating engraved into the waveguide core, a waveguide core and a grating arranged next to the waveguide core, and a waveguide core and a grating provided parallel to the waveguide core.

19. The optical device according to claim 12, wherein:
the two or more contacts include a first contact and a second contact;
the first contact is provided on one side of the waveguide grating and extends in parallel to the waveguide grating; and
the second contact is provided on the other side of the waveguide grating and extends in parallel to the waveguide grating.

20. A tunable laser device for Lidar applications, the tunable laser device comprising at least one optical device according to claim 11, wherein the optical device is an optical cavity of the tunable laser device.

\* \* \* \* \*